United States Patent
Kokawa et al.

(10) Patent No.: US 8,884,393 B2
(45) Date of Patent: Nov. 11, 2014

(54) NITRIDE COMPOUND SEMICONDUCTOR DEVICE AND MANUFACTURING METHOD THEREOF

(71) Applicant: Advanced Power Device Research Association, Yokohama (JP)

(72) Inventors: Takuya Kokawa, Kanagawa (JP); Tatsuyuki Shinagawa, Kanagawa (JP); Masayuki Iwami, Kanagawa (JP); Kazuyuki Umeno, Kanagawa (JP); Sadahiro Kato, Kanagawa (JP)

(73) Assignee: Furukawa Electric Co., Ltd., Tokyo (KP)

( * ) Notice: Subject to any disclaimer, the term of this patent is extended or adjusted under 35 U.S.C. 154(b) by 0 days.

(21) Appl. No.: 13/938,653

(22) Filed: Jul. 10, 2013

(65) Prior Publication Data
US 2014/0084298 A1 Mar. 27, 2014

(30) Foreign Application Priority Data
Sep. 25, 2012 (JP) ................. 2012-210942

(51) Int. Cl.
*H01L 29/15* (2006.01)
*H01L 29/06* (2006.01)
*H01L 29/778* (2006.01)
*H01L 29/205* (2006.01)
*H01L 29/20* (2006.01)
*H01L 29/66* (2006.01)

(52) U.S. Cl.
CPC .......... *H01L 29/205* (2013.01); *H01L 29/0692* (2013.01); *H01L 29/7787* (2013.01); *H01L 29/2003* (2013.01); *H01L 29/66462* (2013.01)
USPC ........................................... 257/438; 438/149

(58) Field of Classification Search
CPC ................................................. H01L 21/02458
USPC ............................................. 257/76; 438/149
See application file for complete search history.

(56) References Cited

U.S. PATENT DOCUMENTS

2004/0173788 A1* 9/2004 Takizawa ..................... 257/12
2013/0328106 A1* 12/2013 Kokawa et al. ............... 257/190

FOREIGN PATENT DOCUMENTS

JP 2009-289956 12/2009

OTHER PUBLICATIONS

U.S. Appl. No. 13/935,834, filed Jul. 5, 2013, Iwami, et al.

* cited by examiner

*Primary Examiner* — Jami M Valentine
(74) *Attorney, Agent, or Firm* — Oblon, Spivak, McClelland, Maier & Neustadt, L.L.P.

(57) ABSTRACT

A nitride compound semiconductor device includes: a substrate; a buffer layer formed on the substrate and including a plurality of composite layers each layered of: a first layer formed of a nitride compound semiconductor; and a second layer formed of a nitride compound semiconductor containing aluminum and having a lattice constant smaller than a lattice constant of the first layer; a semiconductor operating layer formed on the buffer layer; and a plurality of electrodes formed on the semiconductor operating layer. At least one of the second layers has oxygen added therein.

10 Claims, 6 Drawing Sheets

| OXYGEN CONCENTRATION [cm$^{-3}$] | LEAKAGE CURRENT [A] | |
|---|---|---|
| | HORIZONTAL DIRECTION | VERTICAL DIRECTION |
| 3.0E+18 | 3.9E-09 | 1.0E-01 |
| 5.1E+19 | 2.4E-09 | 4.2E-04 |
| 8.0E+19 | 1.8E-09 | 1.0E-04 |
| 1.3E+20 | 8.4E-10 | 2.9E-08 |

FIG.7

| OXYGEN CONCENTRATION [cm$^{-3}$] | LEAKAGE INCREASE RATIO | COLLAPSE AMOUNT |
|---|---|---|
| 1.0E+18 | 20 | 1.1 |
| 3.0E+18 | 10 | 1 |
| 5.0E+18 | 7 | 1.2 |
| 7.0E+18 | 3 | 1.1 |
| 1.0E+19 | 1.2 | 1 |
| 2.0E+19 | 1.3 | 1.2 |
| 5.0E+19 | 1 | 1.3 |
| 8.0E+19 | 1.1 | 1.4 |
| 1.0E+20 | 1.2 | 3.5 |
| 2.0E+20 | 1 | 5 |

NITRIDE COMPOUND SEMICONDUCTOR DEVICE AND MANUFACTURING METHOD THEREOF

CROSS-REFERENCE TO RELATED APPLICATION

The present application claims priority to and incorporates by reference the entire contents of Japanese Patent Application No. 2012-210942 filed in Japan on Sep. 25, 2012.

BACKGROUND OF THE INVENTION

1. Field of the Invention

The present disclosure relates to a nitride compound semiconductor device and a manufacturing method thereof.

2. Description of the Related Art

Wide band-gap semiconductors represented by group III-V nitride compounds (chemical formula: $Al_xIn_yGa_{1-x-y}As_uP_vN_{1-u-v}$ (wherein $0 \leq x \leq 1$, $0 \leq y \leq 1$, $x+y \leq 1$, $0 \leq u \leq 1$, $0 \leq v \leq 1$, and $u+v<1$)) have high breakdown voltage, good electronic transport property, and good thermal conductivity, and thus are very appealing as a material for high temperature, high power, or high frequency semiconductor devices. Further, in field effect transistors (FETs) having, for example, an AlGaN/GaN heterostructure, two-dimensional electron gas is generated at an interface thereof by the piezoelectric effect. The two-dimensional electron gas has high electron mobility and high carrier density, and is receiving much attention. Moreover, heterojunction FETs (HFETs) using an AlGaN/GaN heterostructure have low on-resistance and fast switching speed and are capable of being operated at high temperature. Consequently, application of integrated circuits such as inverter circuits formed using these nitride compound semiconductors under a high temperature environment or under a high voltage that could not be used before is hoped for (see, for example, Japanese Patent Application Laid-open No. 2009-289956).

Accordingly, use of nitride compound semiconductor devices applied under a high voltage is desired. However, when a high voltage is applied to a nitride compound device, the device may deteriorate and current leakage may occur and leakage current may increase over time.

Accordingly, there is a need to provide a nitride compound semiconductor device with suppressed current leakage and a manufacturing method thereof.

SUMMARY OF THE INVENTION

According to an aspect of the present invention, a nitride compound semiconductor device includes: a substrate; a buffer layer formed on the substrate and including a plurality of composite layers each layered of: a first layer formed of a nitride compound semiconductor; and a second layer formed of a nitride compound semiconductor containing aluminum and having a lattice constant smaller than a lattice constant of the first layer; a semiconductor operating layer formed on the buffer layer; and a plurality of electrodes formed on the semiconductor operating layer. At least one of the second layers has oxygen added therein.

Further, according to another aspect of the present invention, a method of manufacturing a nitride compound semiconductor device includes: forming, on a substrate, a buffer layer including a plurality of composite layers each layered of: a first layer formed of a nitride compound semiconductor; and a second layer formed of a nitride compound semiconductor containing aluminum and having a lattice constant smaller than a lattice constant of the first layer; forming a semiconductor operating layer on the buffer layer; and forming a plurality of electrodes on the semiconductor operating layer. The forming of the buffer layer includes adding oxygen in at least one of the second layers.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 7 is a table illustrating a relation between the oxygen concentration of the second layers and leakage increase ratio or amount of collapse;

DETAILED DESCRIPTION OF THE PREFERRED EMBODIMENTS

Figure 1:
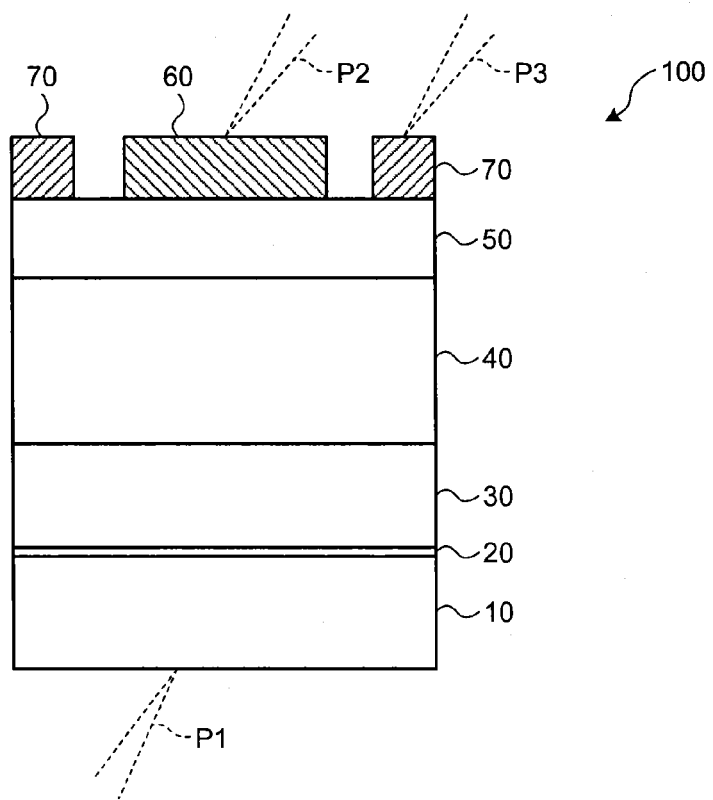
FIG. 1 is a schematic cross-sectional view of an SBD that is a nitride compound semiconductor device according to a first embodiment.

Hereinafter, embodiments of a nitride compound semiconductor device according to the present invention will be described in detail with reference to the accompanying drawings. The invention is not limited by the embodiments. Further, in the drawings, the same or corresponding devices are appended with the same reference numerals or symbols as appropriate. Furthermore, it should be noted that the drawings are schematic, and thicknesses of respective layers, ratios between their thicknesses, and the like may be different from the actual. Moreover, portions having relations or ratios between their dimensions that differ among the drawings may be included.

First Embodiment

Figure 2:
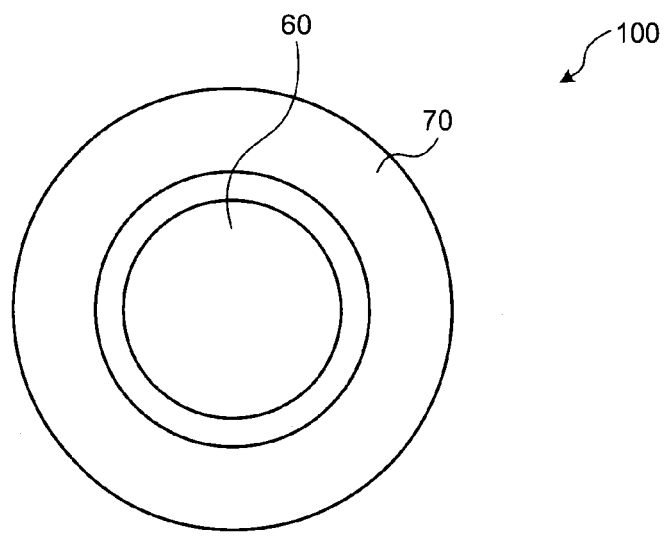
FIG. 2 is a top view of the SBD illustrated in FIG. 1.

FIG. 1 is a schematic cross-sectional view of a Schottky barrier diode (SBD) that is a nitride compound semiconductor device according to a first embodiment of the invention. FIG. 2 is a top view of the SBD illustrated in FIG. 1.

This SBD 100 includes a substrate 10 formed of silicon with a principal surface thereof being a silicon (111) surface; and an interstitial layer 20 formed of AlN, a buffer layer 30, an electron transit layer 40 formed of GaN, and an electron supply layer 50 formed of AlGaN, which are formed on the substrate 10 in sequence; and an anode electrode 60 that is a Schottky electrode and a cathode electrode 70 that is an ohmic electrode, which are formed on the electron supply layer 50. The anode electrode 60 is a round electrode with a diameter of, for example, 160 micrometers, and the cathode electrode 70 is formed to surround the anode electrode 60. The spacing between the anode electrode 60 and the cathode electrode 70 is, for example, 10 micrometers.

The electron transit layer 40 and the electron supply layer 50 constitute a semiconductor operating layer. In the electron transit layer 40 near an interface of an AlGaN/GaN structure formed of the electron transit layer 40 and the electron supply layer 50, two-dimensional electron gas is generated. This two-dimensional electron gas serves as an electric current path between the anode electrode 60 and the cathode electrode 70.

Figures 3, 4:
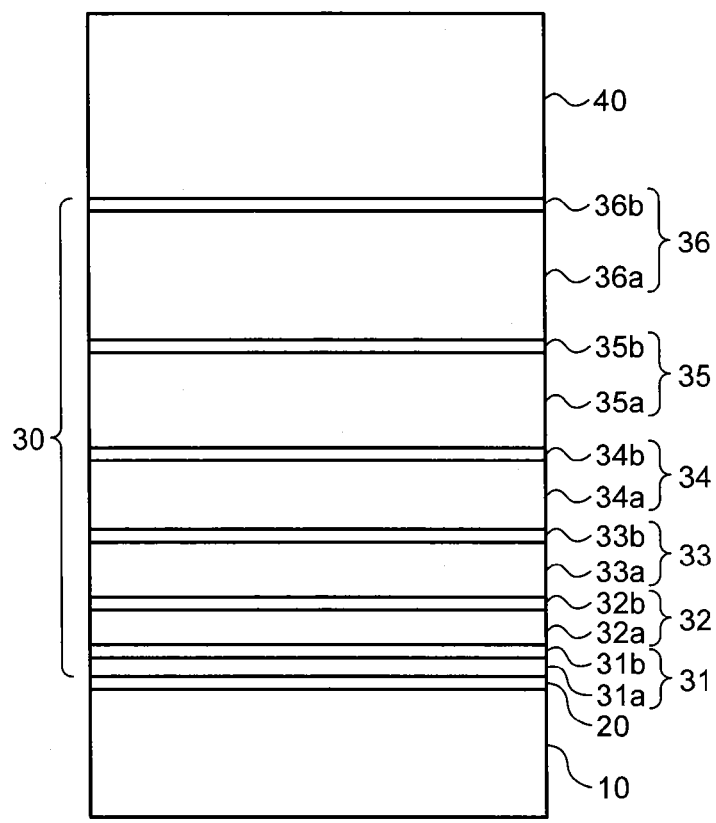
FIG. 3 is a diagram illustrating a structure of a buffer layer of the SBD illustrated in FIG. 1.
FIG. 4 is a table illustrating a relation between oxygen concentration of second layers and leakage current.

FIG. 3 is a diagram illustrating a structure of the buffer layer 30 of the SBD 100 illustrated in FIG. 1. As illustrated in FIG. 3, the buffer layer 30 includes a plurality of composite layers 31, 32, 33, 34, 35, and 36. The composite layer 31 includes: a first layer 31a formed of GaN that is a nitride compound semiconductor; and a second layer 31b formed of AlN that is a nitride compound semiconductor containing aluminum and having a lattice constant smaller than that of GaN, which are layered on top of each other. Likewise, the other composite layers 31 to 36 respectively include first layers 31a to 36a formed of GaN and second layers 31b to 36b formed of AlN, which are layered on top of one another.

The silicon forming the substrate 10 has a lattice constant of 0.384 nanometer and a thermal expansion coefficient of $3.59 \times 10^{-6}$/K. The GaN forming the first layers 31a to 36a has a lattice constant of 0.3189 nanometer which is smaller than that of the silicon, and an expansion coefficient of $5.59 \times 10^{-6}$/K which is greater than that of the silicon. The AlN forming the second layers 31b to 36b has a lattice constant of 0.3112 nanometer and a thermal expansion coefficient of $4.2 \times 10^{-6}$/K.

In each of the second layers 31b to 36b formed of AlN in the buffer layer 30, oxygen is added therein. This yields the effects described below, and as a result, current leakage is reduced. Furthermore, deterioration of the device over time (an increase in leakage current over time) upon a long-term electric-conduction through the SBD 100 is suppressed. Along with this, occurrence of current collapse and an increase thereof over time are also suppressed.

First, adding oxygen to the second layers 31b to 36b formed of AlN forms aluminum oxynitride (AlON) in the second layers 31b to 36b. As for aluminum, a band gap of its oxide ($Al_2O_3$) is 8.7 eV and higher than a band gap of its nitride (AlN), which is 6.3 eV. Consequently, the formation of AlON makes the second layers 31b to 36b highly resistive. As for AlN crystal, its surface does not grow smoothly as compared with GaN crystal, and V-pits may be formed on the surface, whereby leakage paths are likely to be formed. In contrast, when AlON is formed in the second layers 31b to 36b to be highly resistive, the leakage is reduced. This allows voltage shares of the first layers 31a to 36a in the buffer layer 30 to be reduced when a high voltage is applied to the SBD 100 because voltage shares of the second layers 31b to 36b are increased as compared with those without oxygen added therein.

Furthermore, also at interfaces of the AlN/GaN structure formed between the first layers 31a to 36a and the second layers 31b to 36b in the buffer layer 30, two-dimensional electron gas is generated. Thus, when a high voltage is applied between the electrodes of the SBD 100, the two-dimensional electron gas present at a location close to the semiconductor operating layer may form an equipotential surface terminating an electric field, and the electric field may not extend downward (toward the substrate) any further than that. At this time, the semiconductor operating layer may receive a voltage higher than as designed, leading to deterioration of the device. In contrast, when oxygen is added in the second layers 31b to 36b, an acceptor level of $O_{Al}$ at which aluminum sites have been substituted by oxygen is generated, compensating the two-dimensional electron gas formed at the AlN/GaN interface. This reduces the concentration of the two-dimensional electron gas in the buffer layer 30. As a result, the electric field sufficiently extends in the buffer layer 30, reducing voltage load on the semiconductor operating layer.

Next, the SBDs that have the structure illustrated in FIG. 1 were fabricated with oxygen added to the second layers 31b to 36b at various concentrations using a metalorganic chemical vapor deposition (MOCVD) method, and electric properties thereof were measured. The addition of oxygen was performed by mixing oxygen gas with a source gas (ammonia ($NH_3$) and trimethylalminum (TMAl) gases) that is used upon epitaxial growth of the second layers 31b to 36b by the MOCVD method. A configuration of the SBDs fabricated is described below.

The substrate 10 was 1 millimeter thick. The interstitial layer 20 formed of AlN was 40 nanometers thick. The first layers 31a to 36a formed of GaN in the buffer layer 30 were 280 nanometers, 320 nanometers, 370 nanometers, 450 nanometers, 550 nanometers, and 700 nanometers thick, respectively. The second layers 31b to 36b formed of AlN were all 48 nanometers thick. The electron transit layer 40 formed of GaN was 1100 nanometers thick. The electron supply layer 50 had a composition of $Al_{0.25}Ga_{0.75}N$ and was 25 nanometers thick. The anode electrode 60 had a Ti/Al structure and a diameter of 160 micrometers. The cathode electrode 70 had a Ni/Au structure. Spacing between the anode electrode 60 and the cathode electrode 70 was 10 micrometers.

Over the whole fabricated SBD, a passivation film of $SiO_2$ having a thickness of 300 nanometers was formed. Then, only portions of the passivation film corresponding to the electrodes and to a probing portion on a bottom surface of the substrate were removed with hydrofluoric acid to form openings, and by making probe needles come in contact therewith as illustrated by probe needles P1, P2, and P3 in FIG. 1, measurement was made.

First, with respect to the fabricated SBDs, leakage current was measured. The measurement was made at room temperature, in darkness, and by two-terminal measurement. A voltage of 400 volts was applied between the anode electrode and the cathode electrode of the SBD such that a negative voltage was on the anode electrode side and a positive voltage was on the cathode electrode side, and the leakage current in a horizontal direction of the device was measured. A voltage of 400 volts was applied between the anode electrode and the substrate of the SBD such that a negative voltage was on the anode electrode side and a positive voltage was on the substrate side, and the leakage current in a vertical direction of the device was measured.

Figure 5:
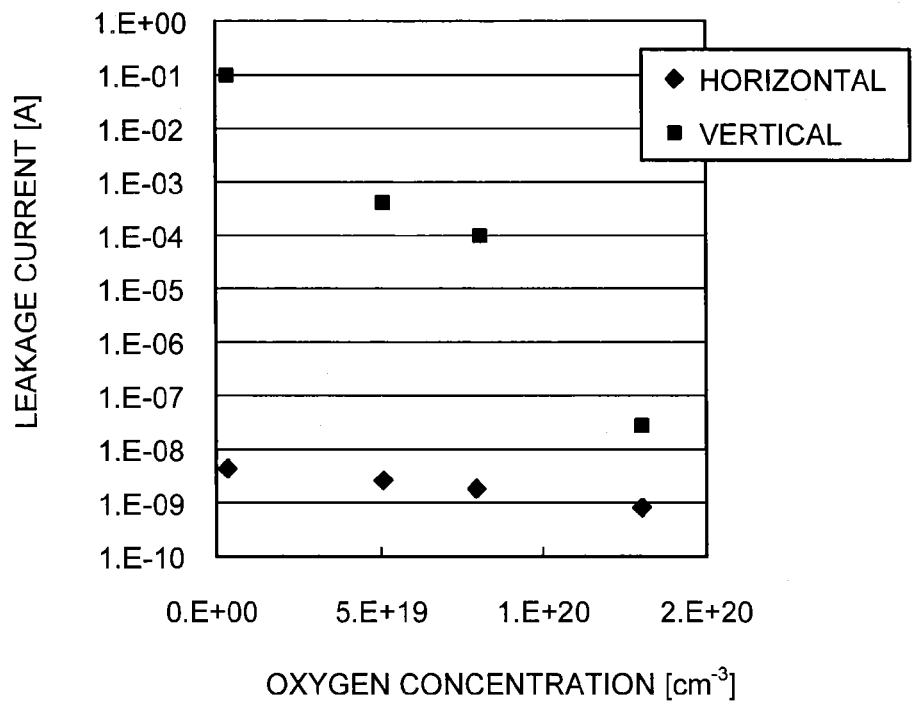
FIG. 5 is a graph of the relation between the oxygen concentration of the second layers and the leakage current illustrated in FIG. 4.

FIG. 4 is a table illustrating a relation of oxygen concentration of the second layers and the leakage current. FIG. 5 is a graph of the relation between the oxygen concentration of the second layers and the leakage current illustrated in FIG. 4. As illustrated in FIGS. 4 and 5, the leakage current was reduced as the oxygen concentration of the second layers was increased. In particular, the reduction of leakage current in the vertical direction was prominent.

Subsequently, an increase in leakage current in the horizontal direction after conducting electricity through the SBD for a long period of time was measured. The measurement was made, similarly to the foregoing, by two-terminal measurement in darkness, and by grounding the substrate and the anode and applying 400 volts to the cathode. The temperature of a stage on which the SBD was placed, however, was set to 175° C. The electric conduction time was set to 10 hours. The ratio of the leakage current after the electric conduction, to the leakage current before the electric conduction, is defined as a leakage increase ratio.

Figure 6:
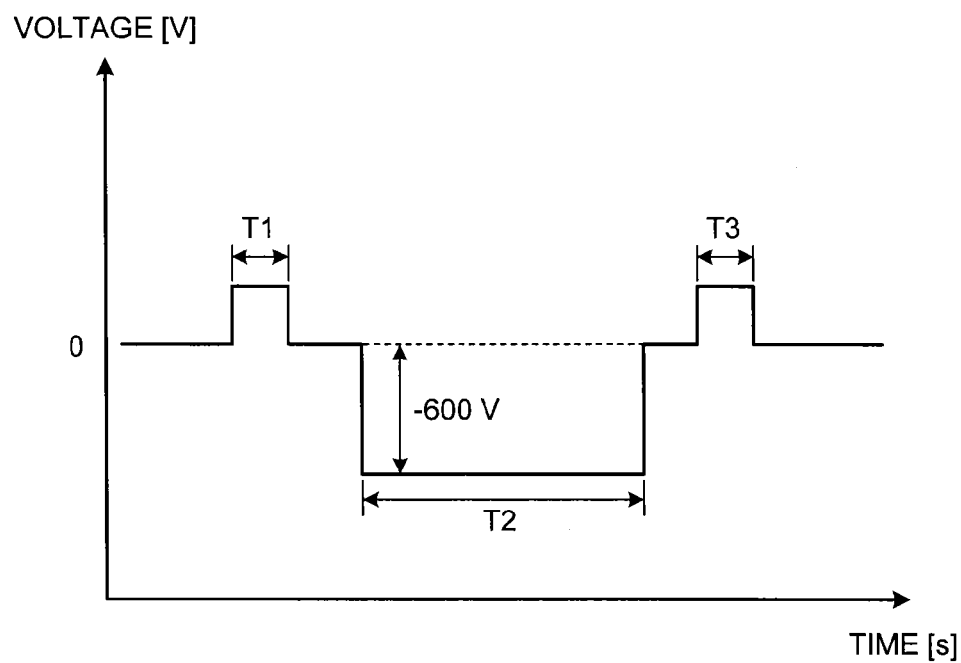
FIG. 6 is a diagram illustrating measurement of amounts of current collapse.

With respect to the SBDs other than those subjected to the above-described long-term electric conduction experiment, amounts of current collapse were measured. The measurement was made at room temperature, in darkness, by connecting the anode electrode and the substrate to be equipotential, and by three-terminal measurement. As illustrated in FIG. 6, an on-resistance (Ron-before) was measured by applying a voltage in a forward direction only for time T1, a reverse direction voltage stress of 600 volts was applied only for time T2 (10 seconds) next, and subsequently, an on-resistance (Ron-after) was measured by applying a voltage in the forward direction again only for time T3. In the measurement of on-resistances (Ron-before and Ron-after), the measurement was made up to an electric current region in which a current value, after a voltage (threshold) at which the forward electric current starts to flow, is linear with respect to the voltage (up to 10 milliamperes). The collapse amount defined by Ron-after/Ron-before was then calculated.

Figure 8:
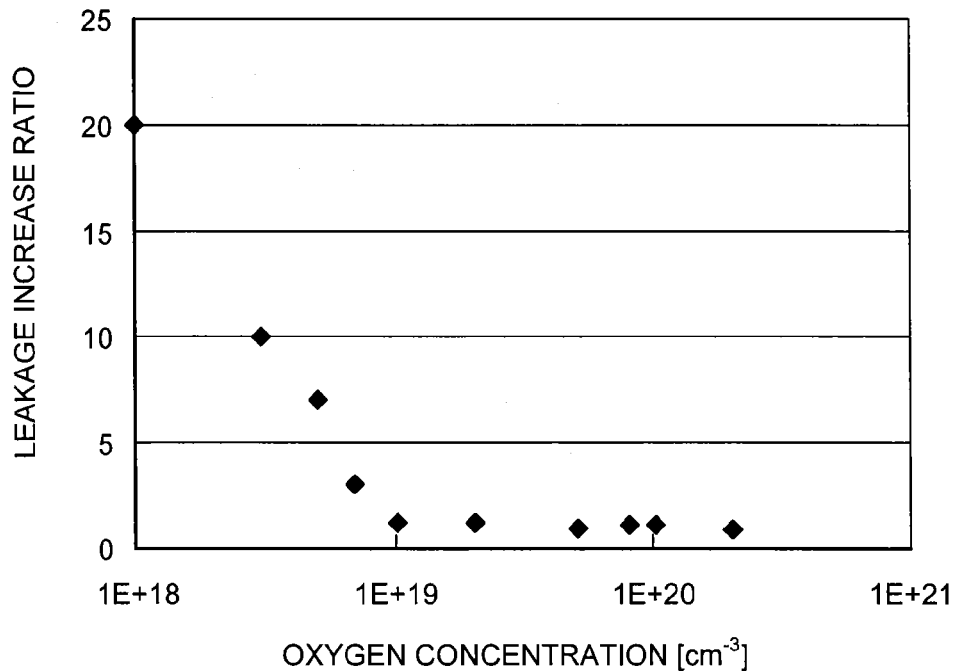
FIG. 8 is a graph of the relation between the oxygen concentration of the second layers and the leakage increase ratio illustrated in FIG. 7.
Figure 9:
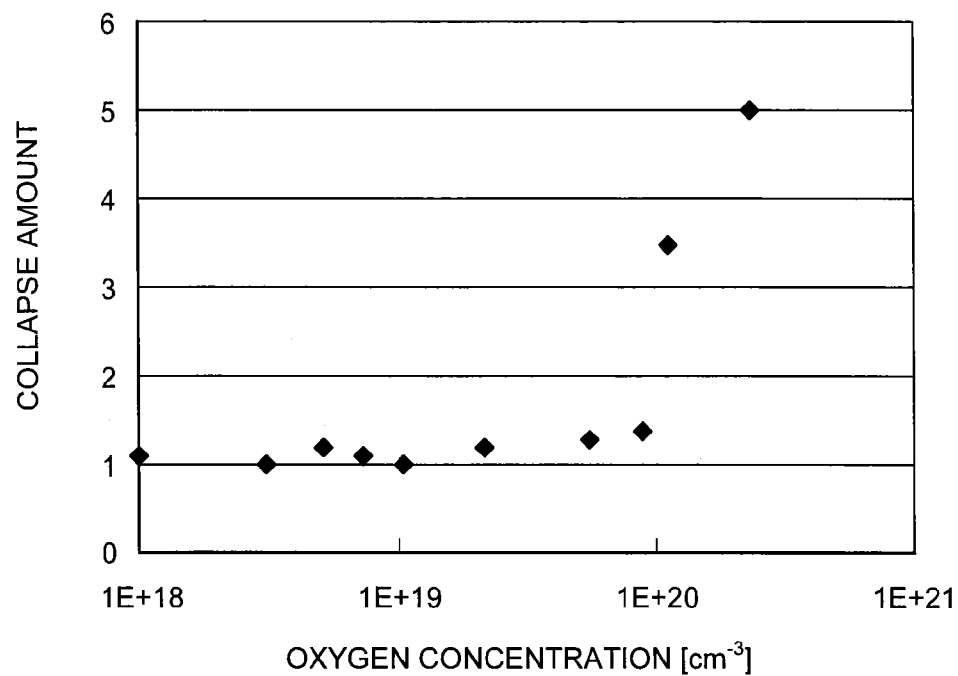
FIG. 9 is a graph of the relation between the oxygen concentration of the second layers and the amount of collapse illustrated in FIG. 7.

FIG. 7 is a table illustrating a relation between the oxygen concentration of the second layers, and the leakage increase ratio or the collapse amount. FIG. 8 is a graph illustrating the relation between the oxygen concentration of the second layers and the leakage increase ratio illustrated in FIG. 7. FIG. 9 is a graph illustrating the relation between the oxygen concentration of the second layers and the collapse amount illustrated in FIG. 7.

As illustrated in FIGS. 7 and 8, the leakage increase ratio was reduced as the oxygen concentration of the second layers was increased, suppressing an increase in leakage current by long-term electric conduction. In particular, when the oxygen concentration was $1 \times 10^{19}$ cm$^{-3}$ or greater, the leakage increase ratio was 1 or of a value close to 1, and there was hardly any increase in the leakage current by the long-term electric conduction.

As illustrated in FIGS. 7 and 9, the collapse amount was almost 1 by the addition of oxygen to the second layers, and there were hardly any occurrence of the current collapse by the reverse direction voltage stress. However, when the oxygen concentration was $1 \times 10^{20}$ cm$^{-3}$ or greater, the collapse amount was increased as the oxygen concentration was increased. Thus, the oxygen concentration is preferably smaller than $1 \times 10^{20}$ cm$^{-3}$.

Next, similarly to the above-described measurement of the current collapse, electric field intensity in the SBD was calculated for a case in which the anode electrode and the substrate were connected to be equipotential and a reverse direction voltage stress of 600 volts was applied. A configuration of the SBD used in the calculation is described below.

The substrate 10 was 1 millimeter thick. The interstitial layer 20 formed of AlN was 40 nanometers thick. The first layers 31a to 36a formed of GaN in the buffer layer 30 were 280 nanometers, 320 nanometers, 370 nanometers, 550 nanometers, 650 nanometers, and 800 nanometers thick, respectively. The second layers 31b to 36b formed of AlN were all 48 nanometers thick. The electron transit layer 40 formed of GaN was 2200 nanometers thick. The electron supply layer 50 had a composition of $Al_{0.25}Ga_{0.75}N$ and was 25 nanometers thick. The anode electrode 60 had a Ti/Al structure and a diameter of 160 micrometers. The cathode electrode 70 had a Ni/Au structure. Spacing between the anode electrode 60 and the cathode electrode 70 was 10 micrometers. Under these conditions, the thickness of the buffer layer 30 becomes about 3.3 micrometers. Further, the buffer layer was formed to have a carbon concentration of about $1 \times 10^{19}$ cm$^{-3}$.

As a result of the calculation, an electric potential difference between the cathode electrode 70 and the AlN/GaN interface (interface at which two-dimensional electron gas is generated) in the composite layer 36, which is located closest to the semiconductor operating layer, right below the cathode electrode 70 was 375 volts, and the electric field was about 1.7 MV/cm. An electric potential difference between the AlN/GaN interface in the composite layer 36 and the substrate 10 was 225 volts, and the electric field was about 0.7 MV/cm. An electric potential difference between the AlN/GaN interface in the composite layer 36 and the anode electrode 60 right below the anode electrode 60 was 225 volts, and the electric field was about 1.0 MV/cm.

As described above, the AlN/GaN interface between the first layer 36a and the second layer 36b of the composite layer 36 located closest to the semiconductor operating layer (interface at which two-dimensional electron gas is formed) receives the highest electric field. It is therefore effective to add oxygen to at least the second layer 36b located closest to the semiconductor operating layer so as to reduce leakage paths and to increase voltage shares.

In the structure of the SBD 100 of the first embodiment, the leakage current in the horizontal direction depends on the thickness of the electron transit layer 40, and the leakage current in the vertical direction depends on the electric field in the buffer layer 30. Furthermore, depending on the structure of the device, the composite layers other than the composite layer located closest to the semiconductor operating layer may receive the highest electric field. In such a case, it is preferable to add oxygen to at least the second layer of the composite layer that receives the highest electric field so as to reduce leakage paths and to increase voltage shares.

Second Embodiment

Figure 10:
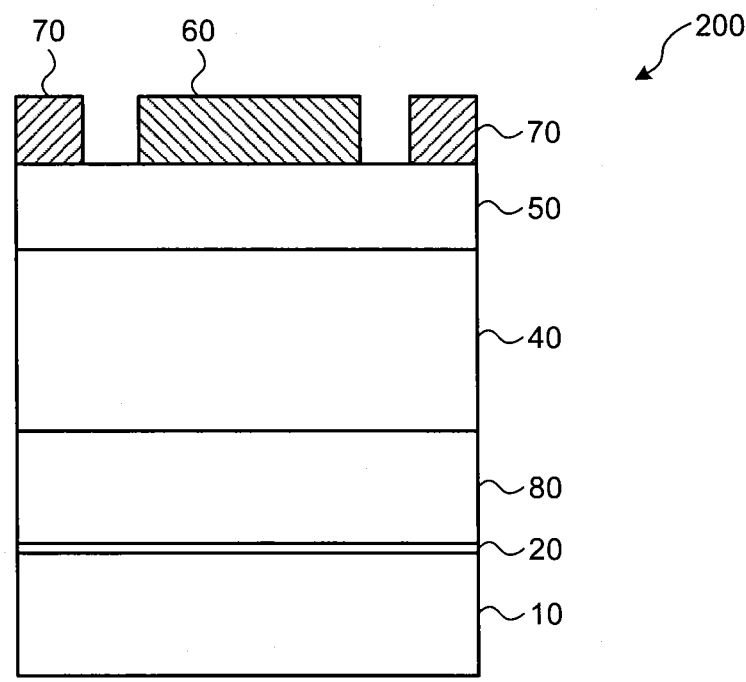
FIG. 10 is a schematic cross-sectional view of an SBD according to a second embodiment.
Figure 11:
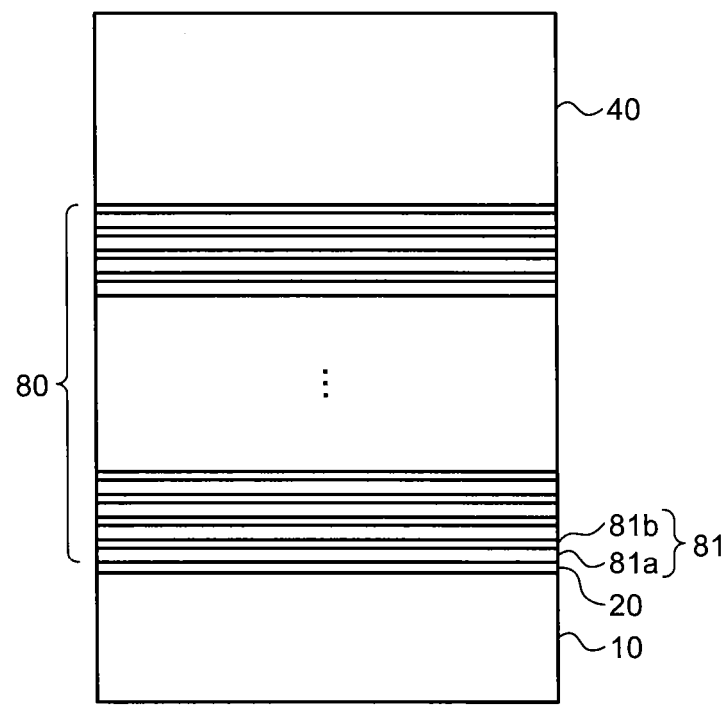
FIG. 11 is a diagram illustrating a structure of a buffer layer of the SBD illustrated in FIG. 10.

FIG. 10 is a schematic cross-sectional view of an SBD that is a nitride compound semiconductor device according to a second embodiment of the invention. FIG. 11 is a diagram illustrating a structure of a buffer layer 80 of the SBD illustrated in FIG. 10.

An SBD 200 has a structure like the SBD 100 according to the first embodiment illustrated in FIG. 1 except for the buffer layer 30 being replaced with a buffer layer 80. The buffer layer 80 includes a plurality of composite layers 81. The composite layer 81 is formed of a first layer 81a formed of GaN that is a nitride compound semiconductor and a second layer 81b formed of AlN that is a nitride compound semiconductor containing aluminum and having a lattice constant smaller than that of GaN, which are layered on top of each other. The number of composite layers is, for example, 84.

The thicknesses of the first layer 81a and the second layer 81b are set to thicknesses in which two-dimensional electron gas is not generated at the AlGaN/GaN interface between the first layer 81a and the second layer 81b. For example, the thicknesses of the first layer 81a and the second layer 81b are 20 nanometers and 5 nanometers, respectively.

In each second layer 81b formed of AlN in the buffer layer 80, oxygen is added. Consequently, similarly to the first embodiment, the current leakage is reduced. Furthermore, deterioration of the device when electricity is conducted through the SBD 200 for a long period of time, is suppressed. Along with this, occurrence of current collapse and an increase thereof over time are also suppressed.

Similarly to the first embodiment, the oxygen concentration of the second layer 81b is preferably $1\times10^{19}$ cm$^{-3}$ or greater and is preferably less than $1\times10^{20}$ cm$^{-3}$.

Next, like in the measurement of the current collapse in the above-described first embodiment, for a case in which the anode electrode and the substrate were connected to be equipotential and a reverse direction voltage stress of 600 volts was applied, electric field intensity in the SBD was calculated. A configuration of the SBD used in the calculation is described below.

The substrate 10 was 1 millimeter thick. The interstitial layer 20 formed of AlN was 40 nanometers thick. The first layers 81a formed of GaN in the buffer layer 80 were 20 nanometers thick. The second layers 81b formed of AlN were 5 nanometers thick. The number of composite layers 81 was eighty-four. The electron transit layer 40 formed of GaN was 2200 nanometers thick. The electron supply layer 50 had a composition of $Al_{0.25}Ga_{0.75}N$ and was 25 nanometers thick. The anode electrode 60 had a Ti/Al structure and a diameter of 160 micrometers. The cathode electrode 70 had a Ni/Au structure. Spacing between the anode electrode 60 and the cathode electrode 70 was 10 micrometers. Under these conditions, the thickness of the buffer layer 80 becomes about 2.1 micrometers. The buffer layer was formed to have a carbon concentration of about $1\times10^{19}$ cm$^{-3}$.

As a result of the calculation, an electric potential difference between the cathode electrode 70 and an upper end of the buffer layer 80 right below the cathode electrode 70 was 320 volts, and an electric field was about 1.5 MV/cm. An electric potential difference between the upper end of the buffer layer 80 and a central portion thereof in a thickness direction right below the cathode electrode 70 was 160 volts, and the electric field was about 1.5 MV/cm. An electric potential difference between the central portion of the buffer layer 80 in the thickness direction and the substrate 10 right below the cathode electrode 70 was 120 volts, and the electric field was about 1.1 MV/cm. An electric potential difference between the central portion of the buffer layer 80 in the thickness direction and the upper end thereof right below the anode electrode 60 was 40 volts, and the electric field was about 0.4 MV/cm. An electric potential difference between the upper end of the buffer layer 80 and the anode electrode 60 right below the anode electrode 60 was 80 volts, and the electric field was about 0.4 MV/cm.

In the structure of the SBD 200 in the second embodiment, from the center of the buffer layer 80 in the thickness direction to near the surface side thereof receives the highest electric field. It is therefore effective to add oxygen to at least the second layers 81b located near the central portion of the buffer layer 80 in the thickness direction so as to reduce leakage paths and to increase voltage shares.

Furthermore, the leakage current in the horizontal direction depends on the total value of: the thickness of the electron transit layer 40; and a half of the thickness of the buffer layer 80, and the leakage current in the vertical direction depends on the electric field below (closer to the substrate than) the central portion of the buffer layer 80 in the thickness direction. Moreover, depending on the structure of the device, a location other than the central portion of the buffer layer 80 in the thickness direction may receive the highest electric field.

In such a case, it is effective to add oxygen to at least the second layer 81b of the composite layer that receives the highest electric field so as to reduce leakage paths and to increase voltage shares.

While the first layer of the composite layer is formed of GaN and the second layer is formed of AlN in the above-described embodiments, limitation is not particularly made thereto, as long as the first layer is formed of a nitride compound semiconductor and the second layer is formed of a nitride compound semiconductor containing aluminum and having a lattice constant smaller than that of the first layer. For example, the first layer may be formed of $Al_xGa_{1-x}N$ ($0 \leq x<1$) and the second layer may be formed of $Al_yGa_{1-y}N$ ($0<x<y \leq 1$). The number of composite layers included in the buffer layer is also not particularly limited. Moreover, as for the electron transit layer and the electron supply layer, their compositions are not particularly limited as long as the electron transit layer is formed of a nitride compound semiconductor, the electron supply layer is formed of a nitride compound semiconductor having a lattice constant smaller than that of the electron transit layer, and two-dimensional electron gas is formed at their interface.

In the above-described embodiments, the addition of oxygen was performed by mixing oxygen gas with the source gas that is used upon the epitaxial growth of the second layer by the MOCVD method. However, the gas for adding oxygen is not limited to oxygen gas, and a gas containing oxygen such as $N_2O$ or $NO_x$, or both of oxygen gas and the oxygen-containing gas may be used. Alternatively, a method of adding oxygen by ion injection or a method of using an Al material having a high oxygen concentration (for example, trimethylalminum) in the MOCVD method may be used. However, the method of adding oxygen by mixing at least one of the oxygen gas and the oxygen-containing gas with the source gas allows oxygen to be added at a sufficient oxygen concentration without leaving any damage by the ion injection, allows oxygen to be added only by a crystal growing process of ordinary MOCVD, and thus is most preferable for effective reduction of leakage current.

Although the nitride compound semiconductor device is the SBD in the above-described embodiments, the type of the device is not particularly limited, and the device may be a field effect transistor in which electrodes formed on an electron supply layer are a source electrode, a gate electrode, and a drain electrode. Furthermore, the structure of the semiconductor operating layer is not limited to the AlGaN/GaN structure, and may be of a single layer structure, a metal oxide semiconductor (MOS) structure, a reduced surface field (RE-SURF) structure, or a field plate structure, for example.

While the thicknesses and the oxygen concentrations of the second layers are the same for each of the composite layers in the above-described embodiments, the thicknesses or the oxygen concentrations may be different from one another. Moreover, there may be a second layer which is not added with oxygen.

Furthermore, a graded composition layer in which the Al composition gradually changes from the Al composition of the first layer to the Al composition of the second layer may be inserted between the first layer and the second layer to reduce dislocation that may occur between the first layer and the second layer. Such a graded composition layer is preferably inserted near the semiconductor operating layer.

According to an embodiment of the present invention, a nitride compound semiconductor device with suppressed current leakage is able to be realized.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A nitride compound semiconductor device, comprising:
   a substrate;
   a buffer layer formed on the substrate and including a plurality of composite layers each layered of:
      a first layer formed of a nitride compound semiconductor; and
      a second layer formed of a nitride compound semiconductor containing aluminum and having a lattice constant smaller than a lattice constant of the first layer;
   a semiconductor operating layer formed on the buffer layer; and
   a plurality of electrodes formed on the semiconductor operating layer, wherein
   at least one of the second layers has oxygen added therein.

2. The nitride compound semiconductor device according to claim 1, wherein the first layer is formed of GaN and the second layer is formed of AlN.

3. The nitride compound semiconductor device according to claim 1, wherein an oxygen concentration of the second layer is $1 \times 10^{19}$ cm$^{-3}$ or greater.

4. The nitride compound semiconductor device according to claim 3, wherein an oxygen concentration of the second layer is smaller than $1 \times 10^{20}$ cm$^{-3}$.

5. The nitride compound semiconductor device according to claim 1, wherein at least the second layer of the composite layer that receives the highest voltage when a voltage is applied between the electrodes, has oxygen added therein.

6. The nitride compound semiconductor device according to claim 1, wherein an interface between the first layer and the second layer of at least one of the composite layers, has two-dimensional electron gas generated thereat.

7. The nitride compound semiconductor device according to claim 6, wherein the second layer of the composite layer located closest to the semiconductor operating layer among the composite layers in which the two-dimensional electron gas is formed, has oxygen added therein.

8. The nitride compound semiconductor device according to claim 1, wherein the nitride compound semiconductor device is a field effect transistor or a Schottky barrier diode.

9. A method of manufacturing a nitride compound semiconductor device, the method comprising:
   forming, on a substrate, a buffer layer including a plurality of composite layers each layered of:
      a first layer formed of a nitride compound semiconductor; and
      a second layer formed of a nitride compound semiconductor containing aluminum and having a lattice constant smaller than a lattice constant of the first layer;
   forming a semiconductor operating layer on the buffer layer; and
   forming a plurality of electrodes on the semiconductor operating layer, wherein
   the forming of the buffer layer includes adding oxygen in at least one of the second layers.

10. The method of manufacturing a nitride compound semiconductor device according to claim 9, wherein the forming of the buffer layer includes adding oxygen in at least one of the second layers by:
   forming the first layer and the second layer using a metalorganic chemical vapor deposition (MOCVD) method; and
   mixing at least one of oxygen gas and a gas containing oxygen, with a source gas that is used in performing epitaxial growth by the MOCVD method.

* * * * *

UNITED STATES PATENT AND TRADEMARK OFFICE
CERTIFICATE OF CORRECTION

PATENT NO. : 8,884,393 B2
APPLICATION NO. : 13/938653
DATED : November 11, 2014
INVENTOR(S) : Takuya Kokawa et al.

It is certified that error appears in the above-identified patent and that said Letters Patent is hereby corrected as shown below:

On the title page, Item (73), the Assignee's Information is incorrect. Item (73) should read:

--(73) Assignee: Furukawa Electric Co., Ltd., Tokyo (JP)--

Signed and Sealed this
Second Day of August, 2016

Michelle K. Lee
*Director of the United States Patent and Trademark Office*